United States Patent
Goetz et al.

(10) Patent No.: US 12,073,290 B2
(45) Date of Patent: Aug. 27, 2024

(54) VECTOR SIGNAL GENERATOR OPERATING ON MICROWAVE FREQUENCIES, AND METHOD FOR GENERATING TIME-CONTROLLED VECTOR SIGNALS ON MICROWAVE FREQUENCIES

(71) Applicant: IQM Finland Oy, Espoo (FI)

(72) Inventors: Jan Goetz, Espoo (FI); Mikko Möttönen, Espoo (FI); Juha Hassel, Espoo (FI); Tuomas Ollikainen, Espoo (FI)

(73) Assignee: IQM Finland Oy, Espoo (FI)

( * ) Notice: Subject to any disclaimer, the term of this patent is extended or adjusted under 35 U.S.C. 154(b) by 435 days.

(21) Appl. No.: 17/438,308

(22) PCT Filed: Mar. 10, 2020

(86) PCT No.: PCT/FI2020/050147
§ 371 (c)(1),
(2) Date: Sep. 10, 2021

(87) PCT Pub. No.: WO2020/183060
PCT Pub. Date: Sep. 17, 2020

(65) Prior Publication Data
US 2022/0188683 A1  Jun. 16, 2022

(30) Foreign Application Priority Data
Mar. 14, 2019  (FI) ...................................... 20195189

(51) Int. Cl.
*G06N 10/00* (2022.01)
*H01B 12/16* (2006.01)
(Continued)

(52) U.S. Cl.
CPC ............. *G06N 10/00* (2019.01); *H01B 12/16* (2013.01); *H01P 1/18* (2013.01); *H01P 1/22* (2013.01);
(Continued)

(58) Field of Classification Search
CPC .......... G06N 10/00; H01B 12/16; H01P 1/18; H01P 1/22; H01P 7/08; H01P 7/00;
(Continued)

(56) References Cited

U.S. PATENT DOCUMENTS 7,613,764 B1   11/2009  Hilton et al.
9,711,836 B1    7/2017  Vela
(Continued)

FOREIGN PATENT DOCUMENTS

CN   107393941   11/2017
EP   0476839    3/1997
(Continued)

OTHER PUBLICATIONS

Barbara et al., "Reentrant ac magnetic susceptibility in Josephson-junction arrays: An alternative explanation for the paramagnetic Meissner effect"; The American Physical Society, vol. 60, No. 10; Sep. 1, 1999, 7 pages.
(Continued)

*Primary Examiner* — Arnold M Kinkead
(74) *Attorney, Agent, or Firm* — Meunier Carlin & Curfman LLC

(57) ABSTRACT

A vector signal generator is capable of operating on microwave frequencies. It comprises a microwave resonator, an output for coupling microwave photons out of said microwave resonator, and a Josephson junction or junction array coupled to the microwave resonator for emitting microwave signals into the microwave resonator. A biasing circuit is provided for applying a bias to the Josephson junction or
(Continued)

junction array. A tunable attenuator is coupled to said microwave resonator.

15 Claims, 5 Drawing Sheets

(51) Int. Cl.
    *H01P 1/18*         (2006.01)
    *H01P 1/22*         (2006.01)
    *H01P 7/08*         (2006.01)
    *H03B 5/08*         (2006.01)
    *H10N 60/12*       (2023.01)
    *H10N 69/00*       (2023.01)

(52) U.S. Cl.
    CPC ............... *H01P 7/08* (2013.01); *H01P 7/082* (2013.01); *H01P 7/086* (2013.01); *H10N 60/12* (2023.02); *H10N 69/00* (2023.02); *H03B 5/08* (2013.01)

(58) Field of Classification Search
    CPC ......... H01P 7/082; H01P 7/086; H10N 60/12; H10N 69/00; H03B 5/08; H03B 15/006; H03B 28/00; B82Y 10/00
    USPC ............. 326/1, 3, 5; 331/182, 185, 96, 94.1; 716/100, 101, 102, 103
    See application file for complete search history.

(56) References Cited

U.S. PATENT DOCUMENTS

| | | | |
|---|---|---|---|
| 2009/0289638 | A1 | 11/2009 | Farinelli et al. |
| 2020/0287343 | A1* | 9/2020 | Kubo ..................... H03F 3/19 |

FOREIGN PATENT DOCUMENTS

| | | |
|---|---|---|
| EP | 3296932 | 3/2018 |
| EP | 3398213 | 8/2019 |
| EP | 3266063 | 3/2020 |
| JP | 09260746 A | 10/1997 |
| JP | 2015206641 A | 11/2015 |
| WO | 2015178990 | 11/2015 |
| WO | 20200183060 | 9/2020 |

OTHER PUBLICATIONS

Hassel et al., "Description of self-synchronization effects in distributed Josephson junction arrays using harmonic analysis and power balance"; arXiv:cond-mat/0605479v1; May 19, 2006; 5 pages.
Goetz et al., "Loss mechanisms in superconducting thin film microwave resonators"; arXiv: 1510.05957v2; Jan. 23, 2016; 9 pages.
Shapiro et al., "Josephson currents in superconducting tunneling: The effect of microwaves and other observations"; Physical Review Letters, vol. 11, No. 2; Jul. 15, 1963; 6 pages.
Pogorzalek et al., "Hysteric Flux Response and Nondegenerate Gain of Flux-Driven Josephson Parametric Amplifiers"; Physical Review Applied; published Aug. 17, 2017; 10 pages.
Goetz et al., "Photon Statistics of Propagating Thermal Microwaves"; arXiv: 1609.07353v3; Mar. 11, 2017; 15 pages.
Goetz et al., "Second-order decoherence mechanisms of a transmon qubit probed with thermal microwaves states"; arXiv: 1609.07351v3; Apr. 11, 2017; 14 pages.
Blais et al., "Effect of noise on geometric logic gates for quantum computation"; arXiv:quant-ph/0105006v3; Feb. 10, 2003; 8 pages.
Bialczak et al., "Fast Tunable Coupler for Superconducting Qubits"; Physical Review Letters; Feb. 11, 2011; 4 pages.
Chen et al., "Qubit architecture with high coherence and fast tunable coupling"; arXiv: 1402.7367v1; Feb. 28, 2014; 10 pages.

Gellar et al., "Tunable coupler for superconducting Xmon qubits: Perturbative nonlinear model"; arXiv: 1405.1915v1; May 8, 2014; 10 pages.
Finnish Search Report issued to FI application No. 20195189, dated Oct. 31, 2019, 2 pages.
Office Action issued to FI application No. 20195189, dated Mar. 30, 2020, 5 pages.
International Search Report issued to PCT/FI2020/050147, dated Aug. 24, 2020, 6 pages.
Van Dijk et al., "The electronic interface for quantum processors"; online journal—www.elsevier.com/locate/micpro; Feb. 21, 2019, 12 pages.
Hofheinz et al., "Bright Side of the Coulomb Blockade"; Physical Review Letters; published May 27, 2011, 4 pages.
Silveri et al., "Theory of quantum-circuit refrigeration by photon-assisted electron tunneling"; QCD Labs COMP Centre of Excellence, Department of Applied Physics, Research Unit of Nano and Molecular Systems, Department of Physics, University of Jyaska; published Sep. 22, 2017, 14 pages.
Chapman et al., "Widely Tunable On-Chip Microwave Circulator for Superconducting Quantum Circuits"; JILA National Institute of Standards and Technology, Department of Physics, Canadian Institute for Advanced Research; published Nov. 22, 2017; 16 pages.
Tan et al., "Quantum-circuit refrigerator"; online—http://www.nature.com/naturecommunications; published May 8, 2017; 8 pages.
Masuda et al., "Observation of microwave absorption and emission from incoherent electron tunneling through a normal-metal-insulator-superconductor junction"; online—www.nature.com/scientificreports; published Mar. 2, 2018; 8 pages.
Kokkoniemi et al., "Flux-tunable phase shifter for microwaves"; online—www.nature.com/scientificreports; published Nov. 7, 2017; 6 pages.
Partanen et al., "Flux-tunable heat sink for quantum electric circuits"; online—www.nature.com/scientificreports; published Apr. 20, 2018; 9 pages.
Mutus et al., "Design and characterization of a lumped element single-ended superconducting microwave parametric amplifier with on-chip flux bias"; Applied Physics Letters 103; published Aug. 6, 2013; 4 pages.
Giazotto, "Opportunities for mesoscopics in thermometry and refrigeration: Physics and applications"; Reviews of Modern Physics, vol. 78; published Mar. 17, 2008; 59 pages.
Yan et al., "The flux qubit revisited to enhance coherence and reproducibility"; online—http://www.nature.com/naturecommunications; published Nov. 3, 2016; 9 pages.
Wallraff et al., "Strong coupling of a single photon to a superconducting qubit using circuit quantum electrodynamics"; Nature, vol. 433, published Sep. 9, 2004; 6 pages.
Koch et al., "Charge insensitive qubit derived from the Cooper pair box"; Department of Physics and Applied Physics; published Sep. 26, 2007; 22 pages.
You-Peng et al. "Progress in superconducting qubits from the perspective of coherence and readout"; Department of Physics; Chin. Phys. B, vol. 22, No. 11; 16 pages.
Durand et al., "The Distributed Josephson Inductance Phase Shifter"; Transactions on Applied Superconductivity, No. 1; Mar. 2, 1992; 6 pages.
Brummer et al., "Phase and Amplitude Modulator for Microwave Pulse Generation"; IEEE Transactions on Applied Superconductivity, vol. 21, No. 3; Jun. 2011; 4 pages.
Yu et al., "Simulation of the spin-boson model with superconducting phase qubit coupled to a transmission line"; Laboratory of Quantum Information Technology; Dec. 28, 2010; 4 pages.
Gulevich et al., "Josephson flux-flow oscillator: The microscopic tunneling approach"; ITMO University; published Jul. 24, 2017; 13 pages.
Lin et al., "Josephson parametric phase-locked oscillator and its application to dispersive readout of superconducting qubits"; online—www.nature.com/scientificreports; published Jul. 25, 2014; 6 pages.
Cassidy et al., "Demonstration of an ac Josephson junction laser"; online—http://science.sciencemag.org/content/355/6328/939; Mar. 2, 2017; 5 pages.

(56) References Cited

OTHER PUBLICATIONS

Office Action issued in corresponding JP Application No. 2021-555419 mailed on Jun. 3, 2024, 5 pages (English-language translation).

* cited by examiner

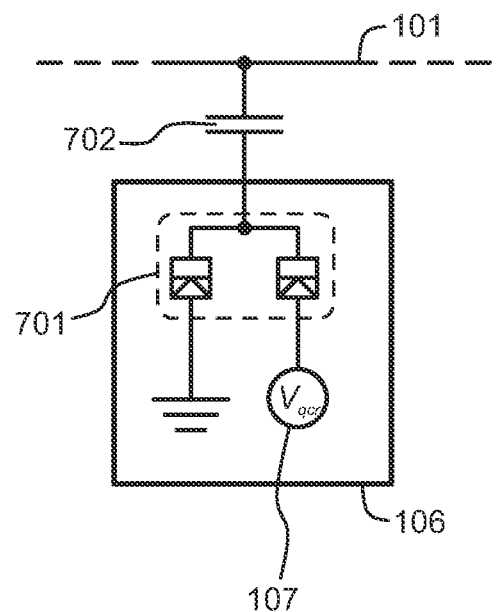
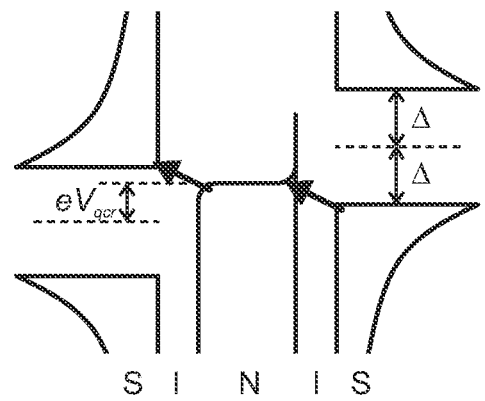
Fig. 7    Fig. 8
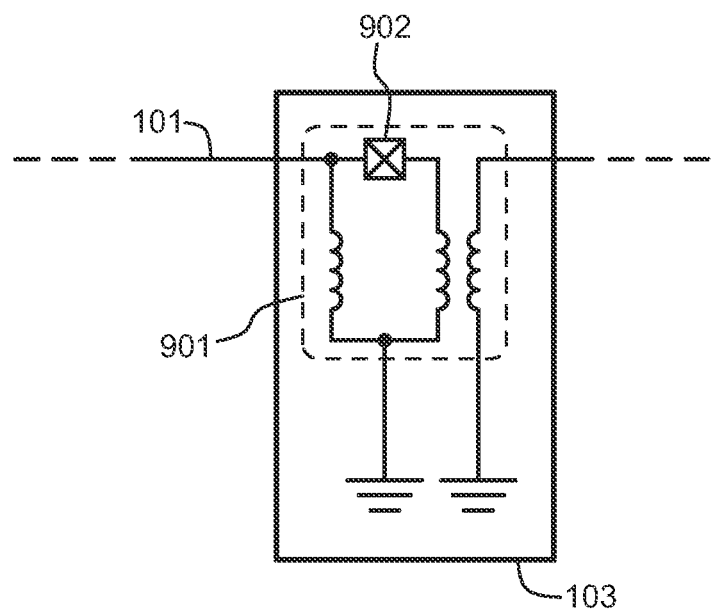
Fig. 9

VECTOR SIGNAL GENERATOR OPERATING ON MICROWAVE FREQUENCIES, AND METHOD FOR GENERATING TIME-CONTROLLED VECTOR SIGNALS ON MICROWAVE FREQUENCIES

PRIORITY CLAIM

This application is a national phase entry of PCT/FI2020/050147, filed on Mar. 10, 2020, which claims priority to Finnish Patent Application No. 20195189, filed on March 14, 2019, the entire disclosures of which are incorporated by reference herein.

FIELD OF THE INVENTION

The invention is generally related to the technical field of generating temporally shaped signals of desired frequency, amplitude, and phase for use as controllable inputs to cryogenically cooled circuits that operate on microwave frequencies. In particular the invention is related to generating such signals inside the cryogenically cooled environment.

BACKGROUND OF THE INVENTION

Technologies like quantum nano-electronics and quantum computing involve the use of very special circuitry that operates at extremely low temperatures that can only be achieved with advanced cryogenic cooling techniques. Oscillating signals on microwave frequencies, in the order of some GHz or even tens or hundreds of GHz, are used as inputs to these circuits. There is thus the need to be able to generate such signals at desired frequency, amplitude, and phase. Both continuous-wave (CW) and pulsed signals may be needed. Similar needs may arise in applications that involve material science, spin-resonance measurements, and communications.

The conventional way of generating signals of said kind involves using baseband signal generators and microwave mixers in room temperature, from which the signals are fed into the cryostat through an arrangement of coaxial cables, filters, and cascaded thermalizing stages. The conventional way involves a number of disadvantages including—but not being limited to—the bulkiness and high cost of the required equipment, the unavoidable occurrence of thermal noise on the transmission lines that needs to be attenuated, and the relatively long latency of any feedback control loops.

These problems become even more difficult as the nano-electronic circuitry becomes more complicated, because the number of signals channels may increase significantly.

SUMMARY

It is an objective of the present invention to present a signal source for generating continuous-wave and pulsed input signals to cryogenically cooled nano-electronic circuitry at desired frequency, amplitude, and phase, while avoiding or at least mitigating the problems of prior art described above. A particular objective of the invention is that the solution should be scalable to operate on a large number of signal channels, while maintaining the thermal loading of the cryostat at a low level. A further objective of the invention is that at least significant parts of the signal source circuitry could be integrated onto a common substrate for using the generated signals locally, without external microwave lines connected to the chip.

These and further advantageous objectives of the invention are achieved with a nano-electronic integrated circuit device that combines a tunable-frequency microwave source, resonator with controllable internal and external quality factors, and a controllable 2*pi phase shifter. The device can be controlled with externally applied voltage pulses.

According to a first aspect there is provided a vector signal generator capable of operating on microwave frequencies. The vector signal generator comprises a microwave resonator, an output for coupling microwave photons out of said microwave resonator, and a first Josephson junction or junction array coupled to the microwave resonator for emitting microwave signals into the microwave resonator. The vector signal generator comprises a first biasing circuit for applying a first bias to said first Josephson junction or junction array, and a tunable attenuator coupled to said microwave resonator.

According to an embodiment said tunable attenuator comprises a SINIS structure and a second biasing circuit for applying a second bias to said SINIS structure, to control the rate at which electrons absorb microwave photons from said resonator in tunneling across said SINIS structure. A SINIS structure comprises a superconductor-insulator-normal conductor-insulator-superconductor link. This involves the advantage that said second bias voltage can be used to control the cooling rate at which microwave photons are absorbed from the microwave resonator.

According to an embodiment said tunable attenuator comprises a second, dissipative resonator of tunable resonance frequency coupled to said microwave resonator. This involves the advantage that a structurally relatively simple solution can be used as a tunable attenuator.

According to an embodiment said output comprises a controllable coupler. This involves the advantage that the external quality factor of the microwave resonator can be independently tuned.

According to an embodiment said controllable coupler comprises a transformer with a primary side and a secondary side, of which said primary side is coupled to said microwave resonator. Said transformer comprises a tunable inductance for tuning a coupling efficiency of microwave photons out of said microwave resonator through said transformer. This involves the advantages that the operation of the controllable coupler is well known and can be controlled flexibly with a relatively simple controlling arrangement, and that unwanted attenuation in the output coupling can be made small.

According to an embodiment said tunable inductance comprises a second Josephson junction or junction array located on said primary side of said transformer, and the vector signal generator comprises a third biasing circuit for applying a third bias to said second Josephson junction or junction array. This involves the advantages that the operation of the controllable coupler is well known and can be controlled with a relatively simple controlling arrangement, and that unwanted attenuation in the output coupling can be made small.

According to an embodiment said controllable coupler comprises at least two outputs from said microwave resonator and a controllable combiner circuit configured to selectively direct microwave signals from said at least two outputs to a common externally coupled circuit. This involves the advantage that a relatively simple structure can be used to achieve at least some controllability in the output coupling.

According to an embodiment the vector signal generator comprises a controllable phase shifter coupled to said output of said microwave resonator for controlling a phase of microwave signals coupled out of said microwave resonator. This involves the advantage that microwave signals of desired phase can be produced.

According to an embodiment said controllable phase shifter comprises at least three tunable elements coupled at different positions along a transmission line leading out of said output of the microwave resonator, wherein said tunable elements are selected from a group comprising tunable resonators, DC SQUIDs, and qubits.

This involves the advantage that controllable phase shift of at least a radians can be produced with very low losses.

According to an embodiment said controllable phase shifter comprises at least five of said tunable elements coupled at different positions along said transmission line. This involves the advantage of added range to the controllable phase shifting, up to a full $2\pi$ range of achievable phase shifts with very low losses.

According to an embodiment each of said tunable resonators comprises a coupling element for making a coupling to said transmission line, a DC SQUID coupled between said coupling element and a reference potential, and a flux bias line of said DC SQUID for controlling a magnetic flux that penetrates a SQUID loop of said DC SQUID. This involves the advantage of precise and lossless controllability of the desired phase shift.

According to an embodiment said tunable resonators are located along said transmission line at mutual distances of a quarter wavelength of microwaves of an operating frequency of said microwave resonator. This involves the advantage of enabling the full $2\pi$ controllability with very small losses.

According to an embodiment said microwave resonator is a tunable microwave resonator that allows its resonance frequency to be tuned within a tuning range; the vector signal generator comprises a filter coupled to said output; and said tuning range of the resonance frequency of said microwave resonator allows tuning said resonance frequency selectively to a stop frequency or a pass frequency of said filter. This involves the advantage that on-off switching of the produced microwave signals is possible in a highly effective manner even at very short time scales.

According to an embodiment said filter is a reflectionless high-pass filter. This involves the advantage that the on/off switching causes very little additional loss.

According to an embodiment the vector signal generator comprises an injection locking input for inputting a seed tone into the microwave resonator. This involves the advantage of strongly reducing the linewidth of the output microwave signals.

According to an embodiment said injection locking input and said controllable coupler are located at opposite ends of said microwave resonator. This involves the advantage that seed locking and (controllable) output coupling can be done independently of each other in a structurally advantageous way.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings:

FIG. 7 illustrates an example of a tunable attenuator that comprises a SINIS link, FIG. 8 illustrates energy levels in a SINIS link, FIG. 9 illustrates an example of a controllable coupler.

DETAILED DESCRIPTION

Figure 1:
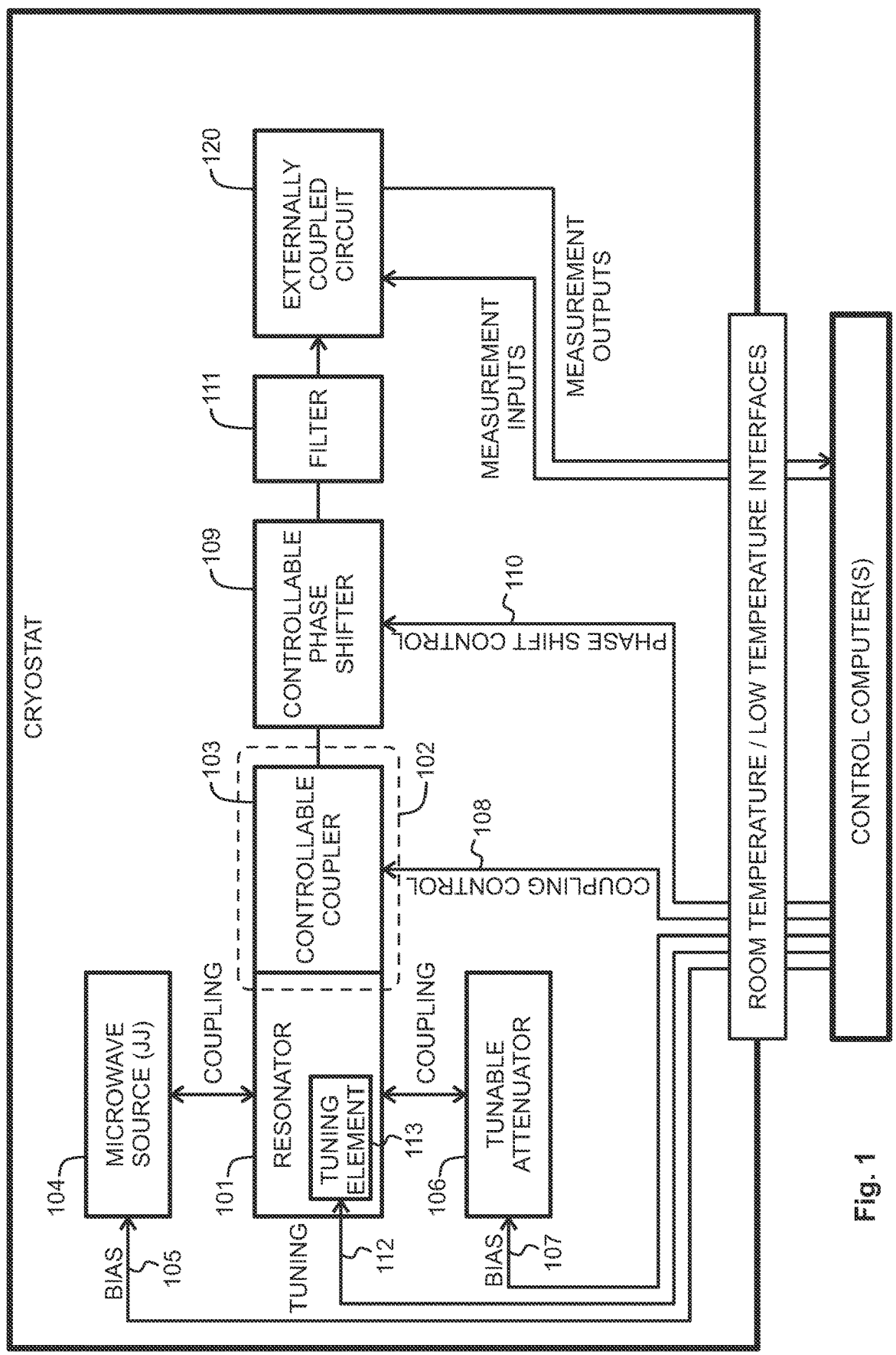
FIG. 1 is a system-level overview of a vector signal generator and some supporting systems.

Numerical descriptors such as "first", "second", and the like are used in this text simply as a way of differentiating between parts that otherwise have similar names. The numerical descriptors are not to be construed as indicating any particular order, such as an order of preference, manufacture, or occurrence in any particular structure.

The conventional way of feeding microwave signals of controllable frequency, phase, and amplitude into a qubit or other nano-electronic circuit in a cryostat involves generating the signals at room temperature and using arrangements of transmission lines and filters to feed them inside the cryostat. The deliberately introduced attenuation that is necessary to remove thermal fluctuations also destroys a vast majority of the useful power. The efficiency of such arrangements, defined as the ratio of the eventually used power over the originally generated power, is so poor that it is not uncommon to generate the signals at well over 1 dBm and only utilize them at way less than −100 dBm. Generating the signals inside the cryostat, with all the desired features of controllability, could enable improving the efficiency by several orders of magnitude, simultaneously simplifying many of the connections that need to be made between the in- and outside of the cryogenic environment.

A vector signal generator described here is a device to control quantum circuits in the field of quantum engineering, quantum computing, and quantum sensing. It is a signal source that provides microwave pulses of well-defined amplitude and phase operating at low temperatures in the millikelvin regime. Synchronized Josephson junctions or comparable microwave signal sources are coupled to a microwave resonator to provide a coherent microwave signal whose amplitude and phase can be controlled by a tunable attenuator. A tunable phase shifter can be used to control the phase of the produced signals. The vector signal generator can output microwave pulses with full IQ (in-phase/quadrature) control in phase space.

Three main aspects are considered in this text. First of these is a device in which both the internal and the external quality factor of the resonator can be tuned independently. This freedom allows to control the emitted microwave power of the device while keeping its total linewidth constant. Furthermore, controlling both the external and internal quality factors enables a fast control of the emitted microwave power as a changing total quality factor could cause transients, with a typical duration corresponding from tens up to >$10^6$ oscillation periods of the emitted microwave signal. In many applications, e.g. those requiring sharp microwave pulses, this is not tolerable. The fast control is enabled by keeping the total quality factor constant while simultaneously tuning the external and internal quality factors. A tunable attenuator is used, preferably realized as a quantum-circuit refrigerator (QCR). A tunable coupler can be used between the resonator and the external transmission line.

The second main aspect is the QCR itself. It provides an active decrease of the thermal noise emitted by the vector signal generator. This functionality is very advantageous for the operation of high-coherence quantum devices, where dissipation and dephasing are often limited by residual thermal occupation of the control lines. In addition, it allows to use the vector signal generator as an intrinsically calibrated noise source.

The third main aspect is a novel type of phase shifter with the striking advantage that is able to induce a full $2\pi$ phase shift. This enlarged dynamic range is possible by increasing the number of non-linear elements from 3 to 5 or even more.

The vector signal generator can output pulses with a carrier frequency of several gigahertz, even if it was operated solely by voltage pulses. Two basic operating modes of the device can be defined as a continuous wave (CW) mode and a pulsed mode. In the CW mode, typical features of microwave generators such as frequency modulation, amplitude modulation, and noise generation are possible. In the pulsed mode, the device can output arbitrary waveforms with sub-nanosecond resolution.

The vector signal generator may have a significant influence on future technology in quantum computing and quantum sensing, but also in classical fields of application such as material science, spin-resonance, and communication. The reduced output noise of the device will improve the operation fidelity of quantum circuits such as qubits, microwave resonators, and parametric amplifiers.

In an advantageous embodiment a number of main elements of the vector signal generator can be integrated either on a single substrate or in a signal package, and mounted in a common, connectorized sample box that can be attached to a suitable part of a cryogenic cooling system. As pointed out above, in the vector signal generator a frequency-tunable microwave source can be controlled in amplitude and phase by at least a tunable attenuator, and preferably also a tunable phase shifter. To minimize output power when the device is in an off-state it can be tuned into a stop-band of a filter, which is preferably a so-called reflectionless filter.

FIG. 1 illustrates schematically the principle of a vector signal generator capable of operating on microwave frequencies. The vector signal generator is shown in FIG. 1 located inside a cryostat that is capable of maintaining its target region, where the devices of interest are located, at a low temperature of desired magnitude. Said temperature is typically lower than 1 K, preferably lower than 100 mK, and may in some cases be even lower than 10 mK. A cryogenic cooling apparatus that includes a dilution refrigerator, together with the appropriate pre-cooling, insulation and radiation shielding, may be used to achieve and maintain the desired low temperature inside the cryostat. Interfaces are provided for allowing power and signal lines pass between the inside and outside of the cryostat. On the outside, one or more control computers are typically used to generate inputs to and store and analyze outputs from the circuits inside the cryostat. The technology of setting up the cryogenic environment and controlling apparatus, as well as providing the required interfaces, is known as such and therefore does not need to be considered here in more detail.

The vector signal generator comprises a microwave resonator 101 and an output 102, of which the last-mentioned is provided for leading the desired signals from the microwave resonator 101 to some other circuit in which the desired signals are to be used. In the schematic representation of FIG. 1 such other circuit appears as the externally coupled circuit 120. It is not necessary to place any limitations here to what the externally coupled circuit 120 comprises or what the signals are there used for. As an illustrative example the externally coupled circuit 120 may comprise one or more qubits that are to be excited and/or the states of which are to be examined with the help of microwave signals of controlled frequency, phase, and amplitude. The output 102 may comprise a controllable coupler 103 for controllably coupling microwave photons out of the microwave resonator 101. Using a controllable coupler is not a necessity, but it enables achieving certain advantages. This and other parts of the output 102 are described in more detail later in this text.

The microwave resonator 101 is preferably a superconducting resonator. It can be realized as a distributed transmission line resonator such as a microstrip resonator or coplanar waveguide resonator, or a resonator formed of lumped elements. It can be a quarter-wavelength or half-wavelength resonator. For the following discussions it suffices to assume that the microwave resonator 101 has a fundamental resonance frequency in the gigahertz range. It is advantageous to use a low-loss superconducting resonator manufactured on a low-loss substrate such as high-resistivity silicon or sapphire. The use of lossy resonators is not excluded, but the use of a lossy resonator lowers the output power, which depends on the total quality factor $Q=Q_{ext}Q_{int}/(Q_{ext}+Q_{int})$, where $Q_{ext}$ and $Q_{int}$ are the external and internal quality factors respectively, through an interplay with the nonlinear Josephson effect.

For emitting microwave signals into the microwave resonator 101, in order to excite and maintain the resonant oscillations in the microwave resonator 101, a microwave source is needed. For this purpose the vector signal generator comprises a first Josephson junction (JJ) or junction array 104 coupled to the microwave resonator 101. Also other kinds of microwave sources are known and could be used, such as thermal emitters, shot noise sources, Gunn diodes, lasers, or the like. However, a Josephson junction or junction array 104 has many advantages like good technological compatibility with the other circuit elements of the kind described here, and advantageous coherence and inherent power level of the generated signals, that advocate its use as the microwave source. The concept of a junction array is here considered to cover also a DC SQUID (Superconducting QUantum Interference Device), which is a parallel circuit of two junctions that forms a loop. The operation of a DC SQUID as a microwave source can be controlled by tuning a magnetic flux that goes through the loop.

A couple of examples for implementing the microwave oscillator based on the first Josephson junction or junction array 104 are described in the following. It should be noted, however, that these are examples only and that other types of oscillators could be used, like a flux-flow oscillator known from D. R. Gulevich et al, Phys.Rev. B 96, 024515 (2017), or a parametric oscillator known from Z. R. Lin et al, Nat. Commun. 5, 4480 (2014). Depending on the parameter regime, the resonantly coupled Josephson junction or junction array can be either in a classical oscillator state or undergo a phase transition into a lasing state. Both schemes use the AC Josephson effect to produce a coherent microwave signal, which is picked up by the microwave resonator 101.

The vector signal generator comprises a first biasing circuit 105 for applying a first bias to the Josephson junction or junction array 104. A role of the first biasing circuit 105 is to make the Josephson junction or junction array 104 generate the microwave signals at a desired frequency. A voltage can be used for biasing, because a bias voltage applied across a Josephson junction makes it resonate at a frequency that depends on the value of the applied bias voltage. Alternatively or additionally current biasing can be used, or a flux bias can be induced with a current. A principle of biasing is to bias the junction to an operating point corresponding to an average voltage $V_b$ to induce the so-called Shapiro steps.

Figure 2:
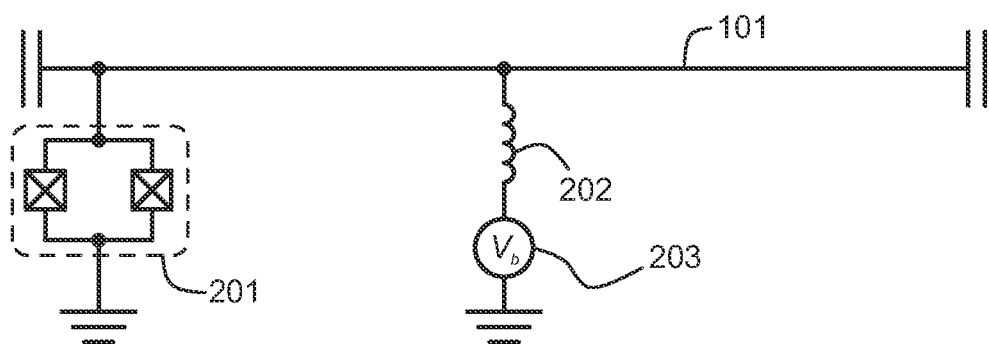
FIG. 2 illustrates an example of tunable excitation of a microwave resonator.
Figure 3:
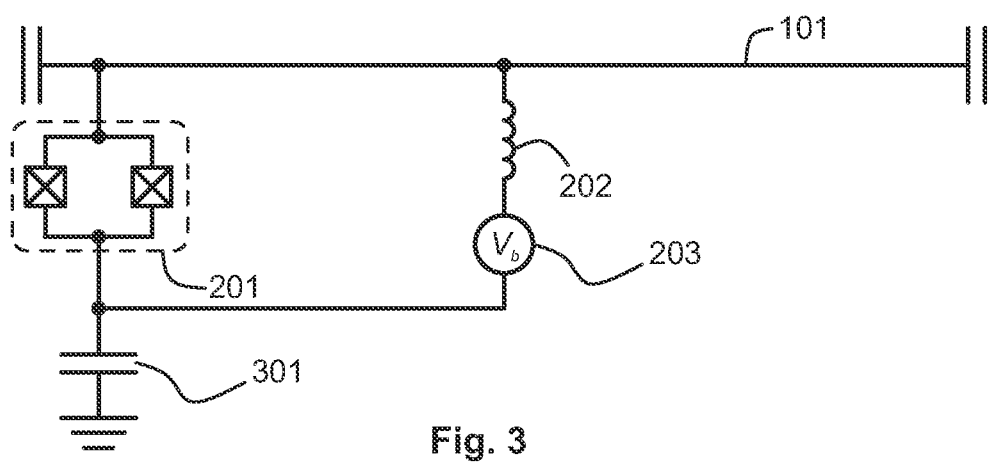
FIG. 3 illustrates an example of tunable excitation of a microwave resonator.
Figure 4:
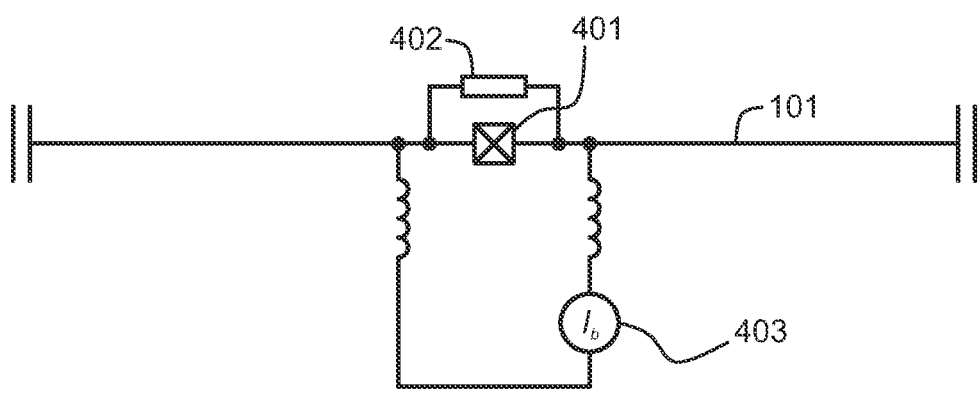
FIG. 4 illustrates an example of tunable excitation of a microwave resonator.

FIGS. 2 to 4 illustrate some exemplary ways of implementing the first Josephson junction or junction array 104 and the first biasing circuit 105 of FIG. 1. The horizontal line represents the microwave resonator 101; it can be considered for example the center conductor of a microwave resonator of transmission line type.

In the embodiment of FIG. 2 the parallel coupling of two Josephson junctions 201 corresponds to the concept of the first Josephson junction or junction array 104 in FIG. 1. A first side of the parallel coupling of two Josephson junctions 201 is coupled to a voltage antinode of the resonator. The opposite side of the parallel coupling of two Josephson junctions 201 is coupled to ground. The bias voltage $V_b$ is applied through a high-inductance on-chip line 202 through the resistor center conductor. The high-inductance coupling of the bias voltage source 203 can be made at or close to the voltage node of the resonator, in order to reduce resonator loss into the bias line.

FIG. 3 illustrates a biasing scheme that is otherwise similar to that of FIG. 2 but differential, so that the node of the bias voltage source 203 that was coupled to ground in FIG. 2 is coupled to the lower side of the parallel coupling of two Josephson junctions 201. From this point there is a coupling to ground through a capacitance 301. Differential biasing of this kind may enable achieving higher voltage stability than the embodiment of FIG. 2.

FIG. 4 illustrates an example of current biasing. A Josephson junction 401 is placed at the voltage node of the resonator and shunted with a shunt resistor 402. A bias current source 403 is coupled across the Josephson junction 401 and the shunt resistor 402.

A shunted or non-shunted Josephson junction could be biased into a metastable state corresponding to a bias voltage $V_b$. A voltage-biased Josephson junction can be operated in two regimes: in a classical synchronized state or in a lasing state. The two regimes depend on the Josephson energy $E_j = \Phi_0 I_c/2\pi$ of the junction, where $\Phi_0 \approx 2fWb$ is the flux quantum and $I_c$ is the critical current of the junction. More specifically, the regimes are separated by the coupling strength $\lambda = E_j/L_r\Phi_0^2$ between the junction and the resonator, i.e., classical if $\lambda \ll 1$ and lasing if $\lambda \gg 1$. Here, $L_r = 1/C_r\omega_r^2$ is the resonator inductance, where $C_r$ is the resonator capacitance. It is possible to tune between the two regimes by realizing the junction as a DC SQUID, as has been described in M. C. Cassidy et al., Science 355, 939 (2017).

Because the junction can be biased to emit a constant power, and the amplitude of the emitted radiation can be tuned with the tunable attenuator and preferably also the tunable coupler, the bias voltage can be optimized for phase coherence. For an ideal system, all the input power applied to the junction $\mathcal{P}_{in} = V_b I_b$ is converted into emitted microwave radiation with a power $\mathcal{P}_{out}$. In this case, the device emits the output power in the order of $\mathcal{P}_{out} = \omega_r I_c \Phi_0/2\pi$, which can be several nW for typical parameters $\omega_r/2\pi \approx 5$ GHz and $I_c \approx 0.5$ mA.

Of shunted and unshunted junctions, unshunted junctions have some fundamental benefits such as fewer fabrication steps, higher efficiency, and less phase noise. One big advantage of the resistively shunted junction is that it is less hysteretic and therefore more straightforward to use. In addition, it is known that junctions operating above the plasma frequency have strong tendency to phase-lock to external or self-generated signals. Thus, it is typically beneficial for the frequency range below 10 GHz to use an additional capacitive shunt to drop the effective plasma frequency.

Figure 5:
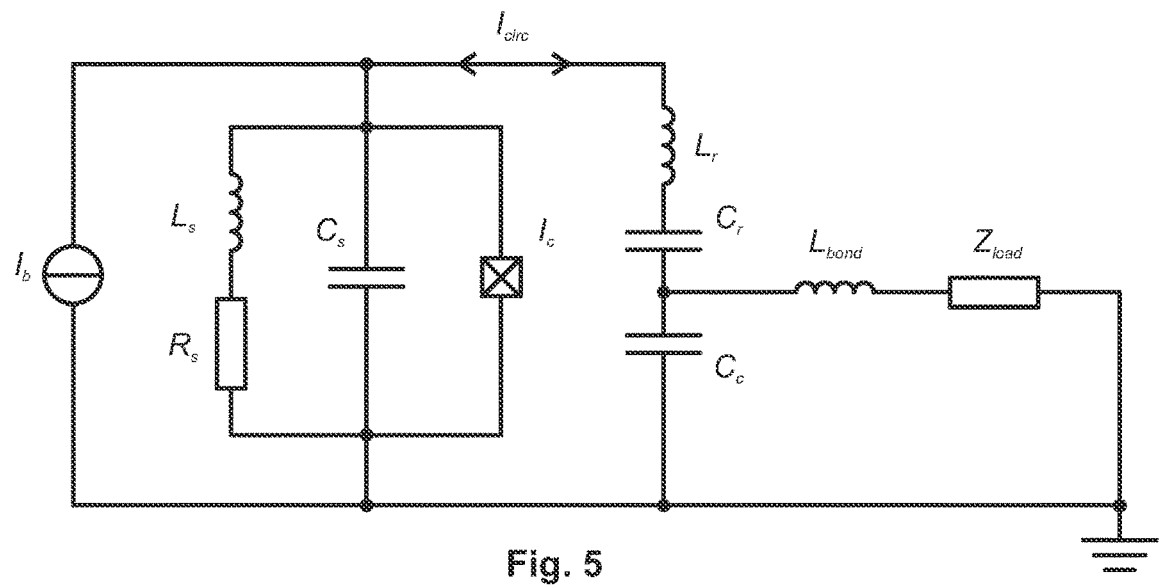
FIG. 5 illustrates an equivalent circuit diagram of a shunted Josephson junction.

FIG. 5 shows the equivalent circuit diagram for a shunted junction ($I_c = 10$ μA) inside a resonator ($\omega_r/2\pi = 5.9$ GHz), which is inductively coupled via wire bonds with inductance $L_{bond} = 2$ nH. Using this model to simulate the dynamics of the system, a time-dependent voltage emitted by the vector signal generator can be obtained. For a suitable bias current, which may be for example in the order of about ten microamperes, the junction synchronizes with the resonator and coherent radiation is emitted into a 50 ohms load $Z_{load}$. The simulated time-resolved voltage emitted into the load resistor has been found to follow a clear sinusoidal behavior with the oscillation period close to that of the resonant frequency $\omega_r/2\pi$. Its amplitude can be for example in the order of some microamperes, and cycle time in the order of a fraction of a nanosecond.

For the shunted junction, the efficiency $\eta = \mathcal{P}_{out}/\mathcal{P}_{in}$ can be a significant fraction of unity for optimized device parameters. The output power can exceed 100 pW, which is sufficient to drive quantum circuits typically operating at several attowatts. The output power may be further increased by using a higher shunt resistance or by integrating more than one junction into the resonator. Alternatively, one could use unshunted junctions, which can operate close to unit efficiency.

Typical ramp-up times may be below 10 ns for shunted junctions. This can be enhanced by the simultaneous tuning of external and internal quality factors as described above. This means that the device can be used in a triggered mode, where the microwave signal is turned on shortly before the actual pulse is required and turned off right after the pulse. Hence, the output is completely off for the rest of the time. Such an operating mode is highly desirable for applications where signal leakage is detrimental. In the triggered mode, the device will be close to a vacuum state with a residual thermal population that can be minimized by the QCR as described below.

In the lasing state, where $\lambda \gg 1$, the system is in a nonlinear regime. In this regime, the voltage bias applied across the Josephson junction results in photon emission into the resonator if $V_b = n\hbar\omega_r/2e$, where n is an index (n ∈ ℕ) and e is the electron charge. If the Cooper pair emission rate $\Gamma_{cp}$ into the resonator exceeds the total loss rate of the system $\kappa_{tot}$, these photons can be reabsorbed and re-emitted by the junction, a process akin to stimulated emission in atomic laser systems. In this regime, the output can significantly increase because the efficiency approaches unity. The reason for this behavior is that the junction also emits into higher-order resonator modes that can be downconverted to the fundamental resonator frequency via the nonlinearity of the Josephson junction. In general, the device can perform near the quantum limit with a linewidth that is determined by thermal fluctuations of the photon number in the resonator.

Referring back to FIG. 1, there is shown a tuning coupling 112 to the microwave resonator 101. Such a feature is advantageous for implementing more flexible tuning of the frequency. For a Josephson junction coupled to a bare resonator, the emitted frequencies are limited to the different harmonic modes of the oscillating circuit. Frequency tunability can be implemented by controlling this mode frequency in-situ, for example by embedding a DC SQUID or other tuning element 113 into the resonator 101 to tune the effective inductance and thus the frequency of the oscillator.

Assuming that the tuning element 113 is a DC SQUID, the modified resonance frequency $\omega_0(\Phi_{sq}) \approx \omega_r [1 + (L_{sq}(\Phi_{sq})/L_r)]^{-1}$ depends on the flux-dependent SQUID inductance $L_{sq}(\Phi_{sq}) = \Phi_0/[4\pi I_c |\cos(\pi \Phi_{sq}/\Phi_0)|]$. Here, $\Phi_{sq}$ is the magnetic flux penetrating the SQUID loop, which can be controlled through an on-chip flux line. For realistic device parameters the tunability may be for example from 2 GHz to 10 GHz, which is suitable to control most state-of-the-art quantum circuits at the time of writing this text. Using a broadband on-chip flux line the resonator frequency can be tuned on a nanosecond timescale.

The vector signal generator of FIG. 1 comprises a tunable attenuator 106 coupled to the microwave resonator 101. The use of a tunable attenuator is advantageous, because it can be used as a part of controlling the amplitude of the emitted signal: tunable dissipation inside the resonator represents a controlled way of damping the electromagnetic field. The other part of controlling the amplitude of the emitted signal is related to the controllable coupler 103, which will be described later in this text. The tunable attenuator 106 is preferably the Quantum-Circuit Refrigerator (QCR) referred to earlier in this text.

Most preferably the tunable attenuator 106 comprises a SINIS structure, as well as a second biasing circuit 107 for applying a second bias to said SINIS structure. In this kind of an arrangement the role of the second bias is to control the rate at which electrons absorb microwave photons from the resonator in tunneling across the SINIS structure. The acronym SINIS comes from the five zones of a superconductor (S)-insulator (I)-normal conductor (N)-insulator (I)-superconductor (S) link.

Figure 6:
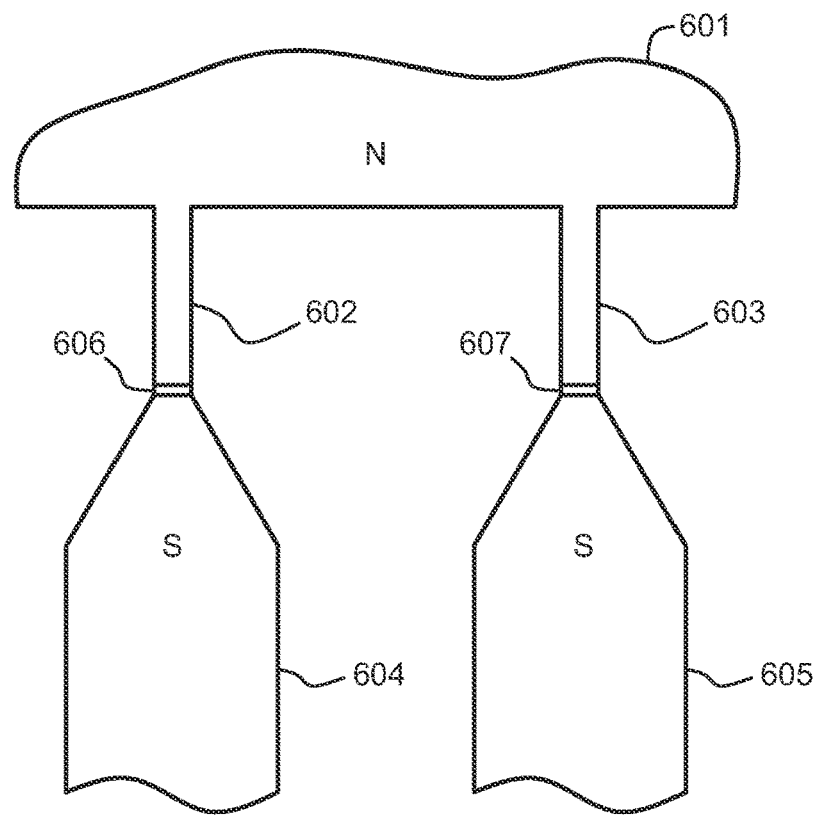
FIG. 6 illustrates an example of a SINIS link.

FIG. 6 illustrates an example of a possible physical implementation of a SINIS structure. A piece 601 of normal conductor, such as a metal that does not become superconductive in low temperatures, has two prongs 602 and 603 protruding from one straight edge thereof. Two pointed strips 604 and 605 made of a material that becomes superconductive in low temperatures are placed so that two thin insulating barriers 606 and 607 are left between the mutually facing tips of each prong and strip. The insulating barriers 606 and 607 can be made of an oxide, for example. The relative dimensions of the structure are only schematically shown in FIG. 6. In a practical structure each of the prongs 602 and 603 may be for example about 1 μm long and 250 nm wide, and the thickness of the insulating barriers 606 and 607 may be in the sub- or single-nm range. The wavy outlines show where the piece 601 of normal conductor and the strips 604 and 605 may continue to bonding pads or corresponding means for coupling them as parts of a larger circuit.

FIG. 7 illustrates an example of a tunable attenuator 106 comprising a SINIS structure 701 in the form of a circuit diagram. The horizontal line at the top represents the microwave resonator 101. From the normal conductor part of the SINIS structure there is a capacitive coupling 702 to the microwave resonator 101. Galvanic coupling could be used in place of the capacitive coupling 702 shown in FIG. 7. One of the superconductor parts is coupled to ground, while the other superconductor part is coupled to a second biasing circuit 107. The notion $V_{qcr}$ is used for the value of the bias voltage in the second biasing circuit 107.

FIG. 8 illustrates the relative energy levels in the grounded superconductor part (S on the left), normal conductor part (N in the middle), and the biased superconductor part (S on the right). The allowable energy levels in each of the superconductor parts exhibit the gap $2\Delta$, where $\Delta$ is the superconducting gap voltage. The biasing makes the whole set of allowable energy levels in the biased superconductor part slide upwards on the energy axis, as schematically shown on the right in FIG. 8. Microwave photons absorbed from microwave resonator 101 may allow electrons to tunnel from the biased superconductor part to the normal conductor part and further to the grounded superconductor part, as shown with the arrows from lower right towards upper left in FIG. 8.

At bias voltages for which $V_{qcr} \simeq \Delta/e$ the photon absorption rate increases exponentially with $V_{qcr}$. This operating regime can be utilized to control the rate of emitted photons $\Gamma_{out}(V_{qcr}) = \delta_{cp} \eta(V_{qcr})$. Here $\eta(V_{qcr}) = \kappa_{ext}/\kappa_{tot}(V_{qcr})$ is the voltage-controlled efficiency, where the total loss rate of the system $\kappa_{tot}(V_{qcr}) = \kappa_{ext} + \kappa_{int} + \delta_{qcr}(V_{qcr})$ depends on the external coupling rate $\kappa_{ext}$, internal loss rate $\kappa_{int}$, and the QCR-induced dissipation $\delta_{qcr}$. Since $\delta_{qcr}$ can be tuned over several orders of magnitude, the amplitude tunability of the vector signal generator may have a similar dynamic range. Voltage control pulses used in the second biasing circuit 107 can be shaped on very short timescales, which allows adjusting the dissipating effect of the QCR with sub-nanosecond accuracy.

In addition to controlling the emitted power of the vector signal generator, a tunable attenuator operating according to the QCR principle allows manipulating the effective temperature of the emitted field leading to improved noise properties of the device. In particular, the QCR may be used to cool the output noise of the vector signal generator through photon-assisted single-electron tunneling. For bias voltages near the superconducting gap, $V_{qcr} \simeq \Delta/e$, the QCR has a sufficient cooling power to lower the effective mode temperature of a resonator. Therefore, the electromagnetic field emitted into the 50 Ohm transmission line can be cooled close to the quantum limit whenever the vector signal generator is in its off state. The emitted field can be cooled to half the electron temperature of the normal-metal island in the QCR, which can be thermalized to approximately 30 mK or below. This active cooling of the output field is important for many applications in quantum engineering where the decoherence properties of the controlled circuits degrade strongly with thermal noise.

Additionally or alternatively the tunable attenuator 106 may comprise a second, dissipative resonator with internal loss rate $\kappa_{int,2} \gg \kappa_{int}, \kappa_{ext}$. Such a second resonator, if used, may be coupled inductively or capacitively with a coupling strength g to the microwave resonator 101. This coupling allows for the dissipation of photons in the second resonator, which photons are generated at rate $\Gamma_{cp}$ by the Josephson junction. The dissipation rate can be tuned by making the second resonator flux-tunable. In this case, the coupling strength g is flux-dependent and the emitted amplitude depends on the detuning between the two resonators. Using this technology, a tunable damping rate over several orders of magnitude can be achieved. Any possible frequency changes due to the dispersive shift of the heat sink (or the QCR) can be compensated for by changing the flux through the SQUID of the main oscillator.

Referring back to FIG. 1 it was pointed out earlier in this text that the output 102 of the vector signal generator may comprise a controllable coupler 103 for controllably coupling microwave photons out of the microwave resonator 101. FIG. 9 illustrates an example of such a controllable coupler 103. The controllable coupler 103 shown in FIG. 9 is located at one end of the microwave resonator 101 and comprises a transformer 901 with a primary side and a secondary side. Basically a controllable coupler could be located at an arbitrary position of the resonator, but certain locations may be more advantageous than others, based on e.g. structural simplicity and/or efficiency of operation. For example, if a half-wavelength resonator is used, an advantageous location for an inductive coupler may be close to the middle of the resonator, where a current antinode of the resonator is located. The primary side of the transformer 901 is coupled to the microwave resonator 101; in FIG. 9 it is at the end of the microwave resonator 101 where a current antinode of this resonator is located. The transformer 901 comprises a tunable inductance for tuning a coupling efficiency of microwave photons out of the microwave resonator 101 through the transformer 901.

In particular, the tunable inductance comprises a second Josephson junction or junction array 902 located on the primary side of the transformer 901. As seen in FIG. 1 the vector signal generator comprises a third biasing circuit 108 for applying a third bias to the second Josephson junction or junction array 902. It should be noted that the example shown in FIG. 9 is just one way of realizing the transformer. The inductors and the Josephson junction or junction array can be in many configurations. A transformer can also be a resonant structure including also capacitances.

Above it was explained how controlling the output power of the vector signal generator with tunable dissipation $\kappa_{int}$ changes the total bandwidth $\kappa_{tot}=\kappa_{ext}+\kappa_{int}$ of the device. To compensate for this effect, the controllable coupler 103 can be used to adjust the external coupling strength $\kappa_{ext}$ between the resonator and the output line. Any tunable coupling element that is compatible with superconducting circuits can be used. Many advantageous embodiments that can be used are based on single Josephson junctions and RF SQUIDs which are either current-biased or flux biased and can reach on/off ratios of up to 30 dB.

Another way of realizing the controllable coupler 103 could involve having multiple outputs from the microwave resonator 101 and controllable means for combining the signals through the various outputs in various ways. The controllable coupler 103 may comprise at least two outputs from the microwave resonator 101 and a controllable combiner circuit configured to selectively direct microwave signals from the at least two outputs to a common externally coupled circuit 120. If controllability of the output coupling is not needed, a simpler, not controllable output coupler of any conventional type can be used.

Referring back to FIG. 1 the vector signal generator may comprise a controllable phase shifter 109 coupled to the output 102 of the microwave resonator 101 for controlling a phase of microwave signals coupled out of the microwave resonator 101. A phase shift control circuit 110 is provided for leading one or more phase shift control signals to the controllable phase shifter 109.

In order to serve best the needs of a versatile microwave signal source it would be desirable to have a phase-shifting capability in as wide a range as possible, most preferably in a full $2\pi$ range. Simultaneously it is very much desirable that the controllable phase shifter would cause as little reflection and attenuation as possible.

According to an embodiment the controllable phase shifter 109 comprises at least three tunable elements coupled at different positions along a transmission line leading out of the output 102 of the microwave resonator 101. Here tunable elements mean components and/or sub-circuits that have for example a tunable resonance frequency, and/or a tunable coupling strength to the transmission line, and/or a tunable impedance between the transmission line and a reference potential such as the ground potential. Elements that can be advantageously used as tunable elements include but are not limited to tunable resonators, DC SQUIDs, and qubits.

Figure 10:
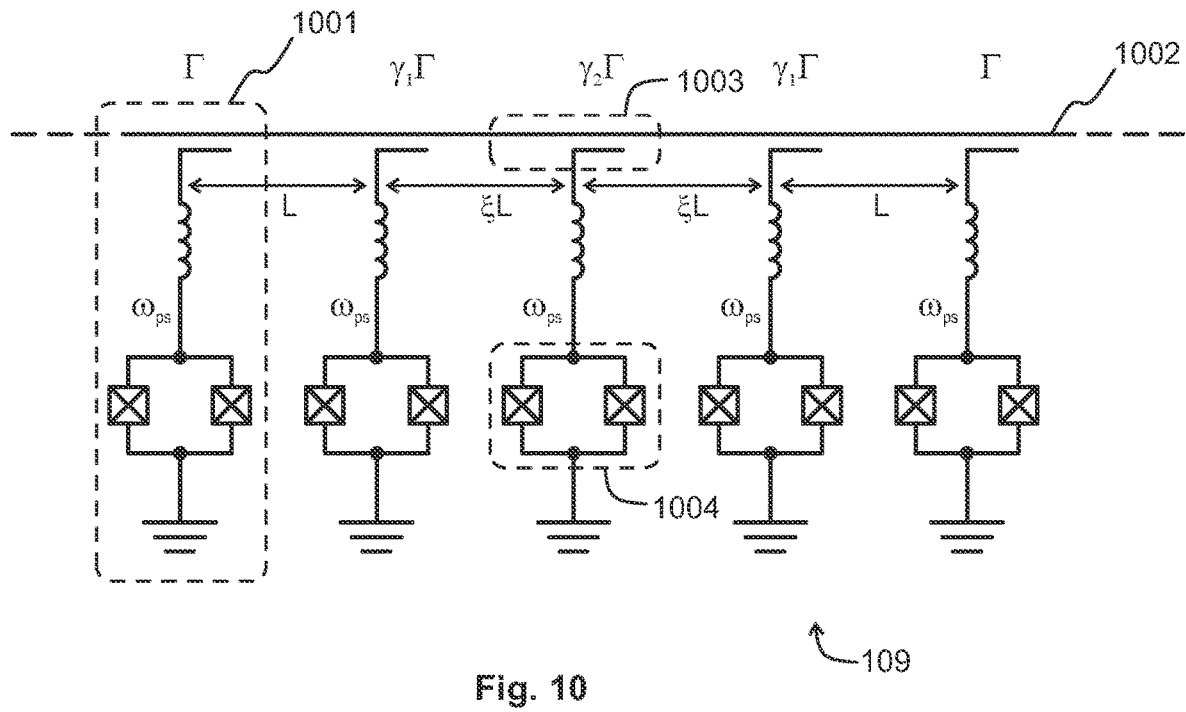
FIG. 10 illustrates an example of a controllable phase shifter.

FIG. 10 illustrates an example of a controllable phase shifter 109 that comprises tunable elements 1001 coupled at different positions along a transmission line 1002. Here it may be assumed that the transmission line 1002 is the transmission line between an output of a microwave resonator and an input of an externally coupled circuit, and it can be realized for example as a CPW (coplanar waveguide) transmission line. As details there are shown a (capacitive) coupling 1003 to the transmission line 1002 and a DC SQUID 1004 as the actual tunable part of the tunable element. On-chip flux bias lines (not shown in FIG. 10) can be used to affect the flux through the SQUID loops and hence the resonance frequency of each tunable element 1001. Inductance matrix techniques can be used to account for possible cross-coupling between different on-chip flux bias lines, if needed. In the schematic representation of FIG. 1 the flux bias lines are included in the phase shift control circuit 110

It has been found that while three tunable elements of the kind shown in FIG. 10 and coupled along the transmission line 1002 enable producing controllable phase shifts to a certain extent, an even larger control range can be achieved when the controllable phase shifter 109 comprises at least five of the tunable elements 1001 coupled at different positions along the transmission line 1002, as shown in FIG. 10. As shown in the paragraphs below, with such five tunable elements it is possible to realize a full $2\pi$ range of phase shifts with minimal attenuation of the signal.

According to an embodiment, each of the tunable elements 1001 comprises a resonator with a transition frequency $\omega_{ps}$. Each of them modifies the complex scattering coefficient $S_{21}$ depending on the detuning $\delta=\omega_r-\omega_{ps}$ between the emitted signal and the resonators. In addition the scattering coefficient depends on the relative distances of the tunable elements along the transmission line 1002 and on their relative coupling strengths to the transmission line 1002. In FIG. 10 the symbol r is used for the coupling strength of the first and fifth tunable elements.

The coupling strength of the second and fourth tunable elements is $\gamma_1\Gamma$ and the coupling strength of the third tunable element is $\gamma_2\Gamma$, where $\gamma_1$ and $\gamma_2$ are proportionality coefficients. The distance between the first and second tunable elements, as well as the distance between the fourth and fifth tunable elements, is L. The distance between the second and third tunable elements and the distance between the third and fourth tunable elements is $\xi L$, where $\xi$ is a proportionality coefficient. The value of L may be for example one quarter of the wavelength of the microwave signal on the transmission line 1002. Suitable values for the proportionality coefficients can be found through mathematical analysis, and/or simulation, and/or experimentation.

Example parameter values leading to a full 2π range of phase shifts are obtained through mathematical analysis as follows. By fixing L=λ/4 and ξ=1 the complex scattering coefficient becomes $$S_{21} = \frac{2\delta^5}{(i\Gamma^2\gamma_1 + \Gamma\gamma_1\delta - i\delta^2)[\Gamma^3\gamma_1\gamma_2 - i\Gamma^2\gamma_1\gamma_2\delta - \Gamma(\gamma_2+2)\delta^2 + 2i\delta^3]}.$$

Full transmission of the signal, i.e., $|S_{21}|^2=1$, is achieved by setting $$\delta = \Gamma\sqrt{\gamma_1 \frac{\gamma_2(\gamma_1-2)-2+\sqrt{4+\gamma_1\gamma_2[4+(\gamma_1-4)\gamma_2]}}{4\gamma_1-2(2+\gamma_2)}}.$$

Finally, fixing $\gamma_1=3$ leads to a phase shift that can be tuned within the full $2\pi$ range by varying $\gamma_2$ through a continuous range of values between 0 and 4.

Referring back to FIG. 1 the vector signal generator comprises a filter 111 coupled to the output 102 of the microwave resonator 101. The filter 111 may find particular use if the microwave resonator 101 is a tunable microwave resonator that allows is resonance frequency to be tuned within a tuning range. Namely, the tuning range may allow tuning the resonance frequency of the microwave resonator selectively to a stop frequency or a pass frequency of the filter 111. This can be done as a part of setting the output of the vector signal generator off or on respectively, as is described in more detail in the following.

To increase the on/off ratio to higher values than achievable with the dissipation-based amplitude control and the tunable coupling described above, the additional filter-based approach introduced above can be used. The idea of this approach is to tune the resonator into the stop-band of a suitable high-pass filter when no output signal should come out of the vector signal generator. This can increase the on/off ratio of the vector signal generator by several orders of magnitude.

Figure 11:
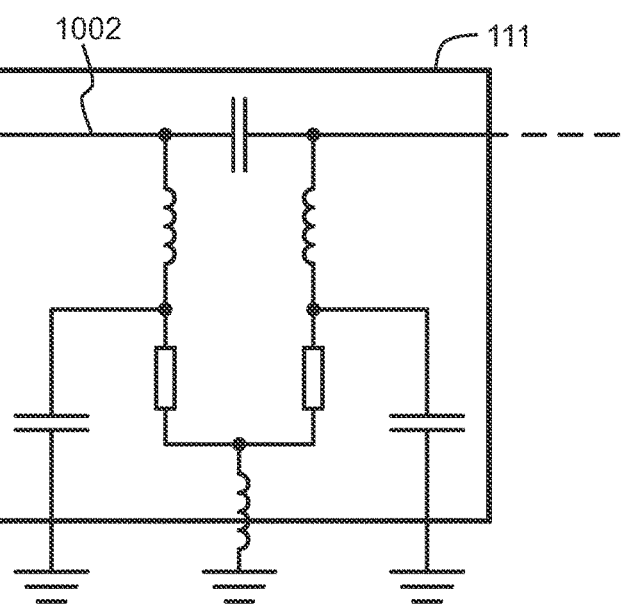
FIG. 11 illustrates an example of a reflectionless filter.

FIG. 11 illustrates schematically one example of a so-called reflectionless high-pass filter 111 coupled to a transmission line 1002. By choosing appropriate reflectionless high-pass filters with a cut-off frequency of approximately 3 GHz, about 25 dB of the emitted power can be absorbed if the resonator is tuned to 2 GHz. Cascading four of these filters in series suppresses the output power by 100 dB, which is sufficient to generate high-fidelity control pulses. Since the resonator frequency can be controlled on a nanosecond timescale, the on/off functionality is comparable to state-of-the-art room-temperature microwave pulse generators that are commercially available at the time of writing this text.

In addition to the examples described so far, the vector signal generator may be suitable for operation in additional modes typically available for signal generators. These operating modes include but are not limited to frequency modulation, amplitude modulation, and noise output. Frequency and amplitude modulation can be achieved by modulating the control fluxes and voltages in the resonator SQUID and the QCR, respectively. Depending on the bandwidth of the control lines, the modulation frequencies can reach into the GHz range.

A noise output is possible by biasing the QCR above the superconducting gap voltage, $V_{qcr} > 2\Delta/e$. In this regime, the vector signal generator emits incoherent microwave photons, which can be used for power calibration purposes or to study the reaction of quantum circuits to external high-frequency noise. Good theoretical understanding of the photon emission process allows predicting the power of the output noise with very high accuracy. Therefore the vector signal generator can be used as a calibrated noise source for power sensitive measurements.

According to an embodiment the vector signal generator may comprise an injection locking input for inputting a so-called seed tone into the microwave resonator 101. If the microwave resonator 101 is a linear structure with two ends, the injection locking input (if present) and the controllable coupler 103 may be located at opposite ends of the microwave resonator 101. Injection locking by feeding a low power coherent seed tone to the vector signal generator strongly decreases the linewidth of the output signal. This technique also allows for the integration of an external frequency reference. To multiplex the reference for many waveform generators, a SIS or Josephson mixer can be used as a frequency multiplier.

The different supply voltages required to operate the vector signal generator can be taken either from a room temperature voltage source or from another cryogenic controller that takes in a constant operation voltage, e.g., 5 V, and regulates several multiplexed outputs.

It is obvious to a person skilled in the art that with the advancement of technology, the basic idea of the invention may be implemented in various ways. The invention and its embodiments are thus not limited to the examples described above, instead they may vary within the scope of the claims.

The invention claimed is:

1. A vector signal generator capable of operating on microwave frequencies, the vector signal generator comprising:
    a microwave resonator;
    an output for coupling microwave photons out of said microwave resonator, wherein said output comprises a controllable coupler;
    a first Josephson junction or junction array coupled to the microwave resonator for emitting microwave signals into the microwave resonator;
    a first biasing circuit for applying a first bias to said first Josephson junction or junction array; and
    a tunable attenuator coupled to said microwave resonator.

2. The vector signal generator according to claim 1, wherein said tunable attenuator comprises a superconductor-insulator-normal conductor-insulator-superconductor link ("SINIS structure"), and a second biasing circuit for applying a second bias to said SINIS structure, to control a rate at which electrons absorb microwave photons from said microwave resonator in tunneling across said SINIS structure.

3. The vector signal generator according to claim 1, wherein said tunable attenuator comprises a second, dissipative resonator having a tunable resonance frequency coupled to said microwave resonator.

4. The vector signal generator according to claim 1, wherein:
    said controllable coupler comprises a transformer with a primary side and a secondary side, of which said primary side is coupled to said microwave resonator, and
    said transformer comprises a tunable inductance for tuning a coupling efficiency of microwave photons out of said microwave resonator through said transformer.

5. The vector signal generator according to claim 4, wherein:
   said tunable inductance comprises a second Josephson junction or junction array located on said primary side of said transformer, and
   said vector signal generator further comprises a second biasing circuit for applying a second bias to said second Josephson junction or junction array.

6. The vector signal generator according to claim 1, wherein said controllable coupler comprises at least two outputs from said microwave resonator and a controllable combiner circuit is configured to selectively direct microwave signals from said at least two outputs to a common externally coupled circuit.

7. The vector signal generator according to claim 1, further comprising a controllable phase shifter coupled to said output of said microwave resonator for controlling a phase of microwave signals coupled out of said microwave resonator.

8. The vector signal generator according to claim 7, wherein said controllable phase shifter comprises at least three tunable elements coupled at different positions along a transmission line leading out of said output of the microwave resonator, and wherein each of said tunable elements is selected from a group comprising tunable resonators, DC SQUIDs, and qubits.

9. The vector signal generator according to claim 8, wherein said controllable phase shifter comprises at least five of said tunable elements coupled at different positions along said transmission line.

10. The vector signal generator according to claim 8, wherein each of said tunable resonators comprises:
   a coupling element for making a coupling to said transmission line;
   a DC superconducting quantum interference device ("SQUID") coupled between said coupling element and a reference potential; and
   a flux bias line of said DC SQUID for controlling a magnetic flux that penetrates a SQUID loop of said DC SQUID.

11. The vector signal generator according to claim 8, wherein said tunable resonators are located along said transmission line at mutual distances of a quarter wavelength of microwaves of an operating frequency of said microwave resonator.

12. The vector signal generator according to claim 1, wherein:
   said microwave resonator is a tunable microwave resonator having a resonance frequency of which is tunable within a tuning range,
   the vector signal generator comprises a filter coupled to said output, and
   said tuning range of the resonance frequency of said microwave resonator allows tuning said resonance frequency selectively to a stop frequency or a pass frequency of said filter.

13. The vector signal generator according to claim 12, wherein said filter is a reflectionless high-pass filter.

14. The vector signal generator according to claim 1, further comprising an injection locking input for inputting a seed tone into the microwave resonator.

15. The vector signal generator according to claim 14, wherein said injection locking input and said controllable coupler are located at opposite ends of said microwave resonator.

* * * * *